United States Patent [19]

Deschenes et al.

[11] 3,757,252

[45] Sept. 4, 1973

[54] DIGITAL COMPANDED DELTA MODULATOR

[75] Inventors: Pierre-André Deschenes, Sherbrooke, Quebec, Canada; Marc Richetin, Toulouse, France; Michel Villeret, Ottawa, Ontario, Canada

[73] Assignee: Universite de Sherbrooke, Sherbrooke, Quebec, Canada

[22] Filed: Dec. 13, 1971

[21] Appl. No.: 207,437

[52] U.S. Cl. .............................. 332/11 D, 325/38 B

[51] Int. Cl. .............................. H03k 13/22

[58] Field of Search .............................. 332/11 R, 11 D; 325/38 B, 38 R

[56] References Cited

UNITED STATES PATENTS

| | | | |
|---|---|---|---|
| 3,638,219 | 1/1972 | Harms | 325/38 R X |
| 3,296,612 | 1/1967 | Tomozawa | 325/38 B X |
| 3,461,244 | 8/1969 | Brolin | 325/38 B |

*Primary Examiner*—Alfred L. Brody
*Attorney*—Raymond A. Robic

[57] ABSTRACT

A digital companded delta modulator comprising a comparator having a first input connected to receive an input analog signal, a second input obtained from an integrator located in the conventional feedback loop of the delta modulator, and pulse generating means connected to the output of the comparator and responsive to a clock for generating a binary pulse of one polarity or the other as determined by the comparator. A binary up and down counter is connected to the pulse generating means through a control circuit which makes the decision as to whether an up count a down count or no count at all is required. The output of the counter is applied to a decoder for converting the binary output of the up and down counter into a number of decimal outputs. An amplifier having a corresponding number of values of gains is connected to the output of the decoder and is thus responsive to the level of the up and down counter for providing a predetermined gain into the feedback loop of the delta modulator. The integrator is connected to the output of the amplifier and its output is connected to the comparator which compares the output signal of the integrator with the input analog signal and generates a signal depending upon the difference between the two signals.

7 Claims, 4 Drawing Figures

DIGITAL COMPANDED DELTA MODULATOR

This invention relates to a digital companded delta modulator conceived for the vocal band as utilized in telephony. It could be used as such in a delta modulation system where only delta modulators are present or in the actual telecommunication network where analog signals and pulse code modulation signals are already present; this last system is called an integrated telecommunication network and requires digital converters to be economical.

A delta modulation system is a digital modulation system in which an analog signal is intermittently sampled and wherein only a change occurring in the amplitude of the analog signal is transmitted instead of the absolute amplitude of the analog sisgnal as it is done in normal pulse code modulation systems. A delta modulation system is also a closed loop system in which the positive and negative pulses generated by the modulator are applied to an integrator located in the feedback loop of the modulator. The output of the integrator is a step signal which is applied to a comparator which compares the instantaneous amplitude of the analog signal with the step signal stored in the integrator and causes the generation of positive or negative pulses depending on the difference between the two signals. If the pulse is positive, the level of the signal in the integrator is raised, whereas, if the pulse is negative, the level of the signal in the integrator is lowered. Therefore the integrator follows the changes of the analog signal.

There are two factors which influence the quality of the signal treated by delta modulation, one called quantizing noise and the other overload distortion. Quantizing noise results from the step signals when they keep constant the value of the signal treated by delta modulation for a fixed period and is thus an approximation to the analog signal. Overload distortion occurs when the variations of the analog signal are too steep to permit the step signals generated at the sampling frequency to follow the analog signal. Although it would be possible to reduce quantizing noise by reducing the size of the step signals, overload distortion would then be increased. Similarly, it would be possible to reduce overload distortion by increasing the size of the step signals, but quantizing noise would then be increased.

The above problem may be overcome by adapting the size of the step signals to the evolution of the analog signal and such operation is known under the term of companding. Various companded delta modulators are known in the art. In some modulators, the information required for adapting the size of the step signals is taken directly from the envelope level and the frequency content of the analog signal such as disclosed, for example, in U.S. Pat. No. 3,461,244 issued Aug. 12, 1969. In a second type of companded modulators, the information required for adapting the size of the step signals is taken from the analysis of the sequence of the step signals transmitted by the modulator. In such companded systems, companding is effected by varying the gain of the feedback loop of the modulator.

In the above-mentioned modulators, two types of companded modulators are known, one type called analog companded modulators and another called digital companded modulators. In the analog companded modulators, a detector is provided for detecting the number of consecutive pulses caused by the appearance of a steep analog signal and for generating a continuous analog signal to an amplitude modulator which provides to the integrator a compensating signal which is continuously variable.

The disadvantages of the analog companded modulators are as follows:

1. in a delta modulation system including plural modulators, there may be a difference in the companding laws of the modulation due to manufacturing tolerances or to the drift of the analog elements, which will cause distortion;

2. in practice, a communication network which utilizes delta modulation systems would also have pulse code modulation systems. It would therefore be necessary to use delta modulation to pulse code modulation converters. One of the elements of such converters is a logic circuit which reproduces the companding law of the modulator. If such law is analog, the converter will only perform an approximative linear translation which will cause distortion.

The digital companded modulators have a digital adaptor which counts the consecutive pulses caused by the appearance of a steep analog signal and which generates discrete analog signals to a step generator which, in turn, vary the gain of the feedback loop. The main difference between the analog companded modulators and the digital companded modulators is thus that, in the analog companded modulators, the compensating signal applied to the integrator varies in a continuous fashion whereas, in the digital companded modulators, such compensating signal varies in steps. One type of digital companded modulators has been disclosed in an article entitled "High Information Delta Modulation" by M.R. Winkler and published in the IEEE International Convention Record, part 8, 1966, pages 260–265. The law of variation of the height of the steps in the Winkler System is exponential; the gain is $2^n$ wherein n is the number of consecutive steps of the same polarity appearing in the sequence of pulses at the output of the modulator. However, the number of levels of the steps must be high in order to obtain sufficient companding and this increases the number of logic circuits and renders the system very complex.

It is therefore the object of the present invention to provide a digital companded modulator which is less complex than the known modulators and yet of good quality. Such a modulator is based on the variation of the law of the gains in the feedback loop and such variation is done in discrete steps; it is of sufficient quality to be used in telephony and thus integrated to the telecommunication network where pulse code modulation systems already exist.

The digital companded modulator, in accordance with the invention, comprises a comparator having a first input connected to an input analog signal, a second input obtained from an integrator located in the normal feedback loop of the delta modulator, and an output connected to a pulse generating means which is responsive to a clock for generating binary pulses of one polarity or the other as determined by the comparator. A binary up and down counter is connected to the pulse generating means through a control circuit which makes the decision as to whether an up count, a down count or no count at all is required. A decoder is connected to the output of the up and down counter for converting the binary output thereof into a number of decimal outputs. An amplifier having a corresponding number of values of gains is connected to the output of the decoder and is thus responsive to the level of the up and down counter for providing a predetermined gain into the feedback loop of the delta modulator. The integrator is connected to the output of the amplifier and its output is connected to the comparator which compares the output of the integrator with the input analog signal and generates a signal depending on the difference between the two signals.

The pulse generating means is a flip-flop which stores the output of the comparator.

The control circuit includes a second flip-flop connected to the output of the first flip-flop and responsive to the clock for storing the preceding output pulse of the comparator. Depending on the output of the first and the second flip-flops, the control circuit provides the counting and decounting to the up and down counter. In addition, the control circuit includes means responsive to the lowest and highest outputs of the decoder for disabling the operation of the up and down counter when such highest or lowest output is reached and when an up count (highest) or a down count (lowest) is asked for.

Gate means are connected to the output of the first flip-flop and to the outputs of the decoder for energizing the corresponding value of amplification of the amplifier.

The invention will now be disclosed with reference to a preferred embodiment thereof, by way of example, and to the accompanying drawings in which.

Figure 1:
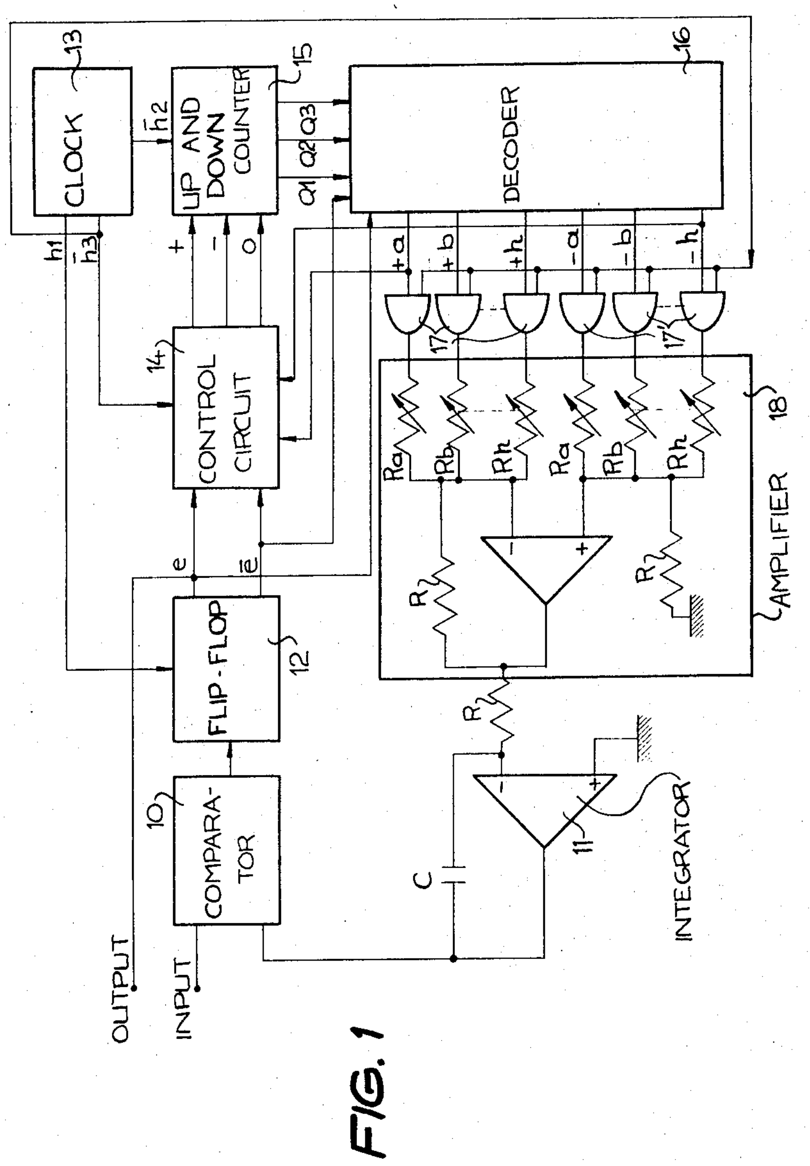
FIG. 1 illustrates a block diagram of the modulator in accordance with the invention.

Referring to FIG. 1, there is shown a digital companded modulator comprising a comparator 10 having a first input to which is applied an analog signal and a second input which is the output of an integrator 11 the function of which will be disclosed later. The output of the comparator 10 is applied to a flip-flop 12 which, under the control of the signal $h_1$ originating from a clock 13, performs a regular sampling operation of the comparator. The function of the flip-flop 12 is also to store the sample signal until the arrival of the next sample. The outputs $e$ and $\overline{e}$ of the flip-flop 12 are applied to a control circuit 14 which, under the control of a signal $\overline{h_3}$ originating from the clock, controls the operation of an up and down counter 15. Depending on the polarity of signals $e$ and $\overline{e}$, on the position of the up and down counter, and also on the polarity of the previous signal, the control circuit 14 will generate a positive signal (+) to increase the level of the counter, a negative signal (−) to decrease the level of the counter, or a zero signal (0) to keep the counter at its actual value.

The output of the up and down counter 15 appears on binary outputs $Q_1$, $Q_2$ and $Q_3$ and, under the control of signal $\overline{h_2}$ from the clock is applied to a decoder 16 for converting such output into decimal output signals $+a, +b, \ldots +h$ of positive value or into decimal output signals $-a, -b, \ldots -h$ of negative value representing the level of the reversible counter 15. The output of the decoder 16 is applied through a series of AND gates 17 and 17' to an amplifier 18 having a number of values of amplification corresponding to the number of output signals $a, b, \ldots h$ and $-a, -b \ldots -h$ of the decoder. Each amplification value is determined by resistors R$a$, R$b$ . . . R$h$ and the choice of the amplification value is determined by the level of the signal stored in up and down counter 15 as decoded by decoder 16. The output of the amplifier is applied to the integrator 11 which provides a step signal which will be compared with the analog signal by the comparator 10.

The output of the flip-flop is transmitted over the regular telephone network towards the other end of the line where a demodulator reconstitutes the analog signal. Such a demodulator is not illustrated but it contains the same elements as FIG. 1 except that the input signal thereof would be applied directly to the flip-flop 12 and the output thereof would be taken from the output of integrator 11, and applied to a bandpass filter working from 0.3 to 3.3 kHz.

Figure 2:
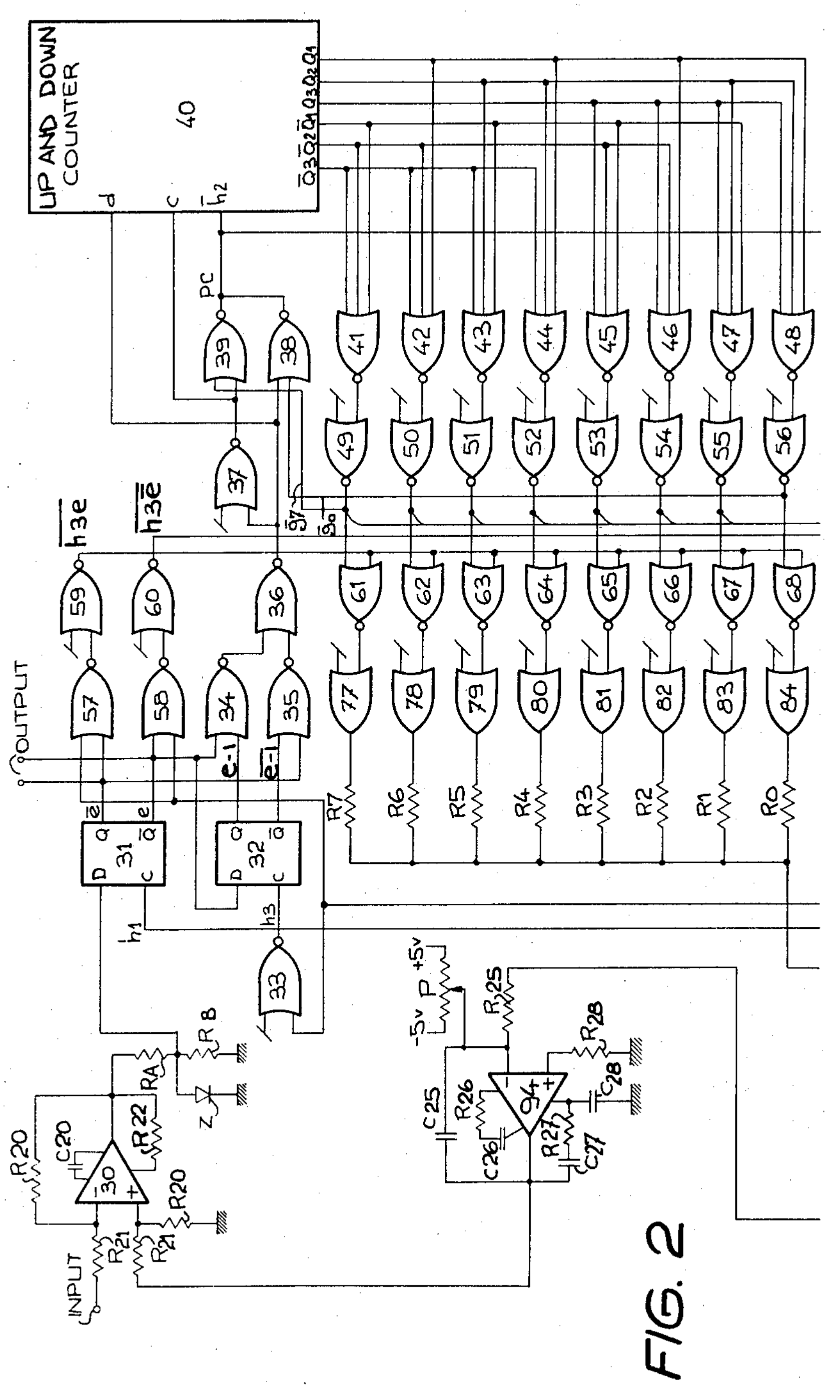
FIGS. 2 and 3 illustrate a detailed circuit of the modulator of FIG. 1.
Figures 3, 4:
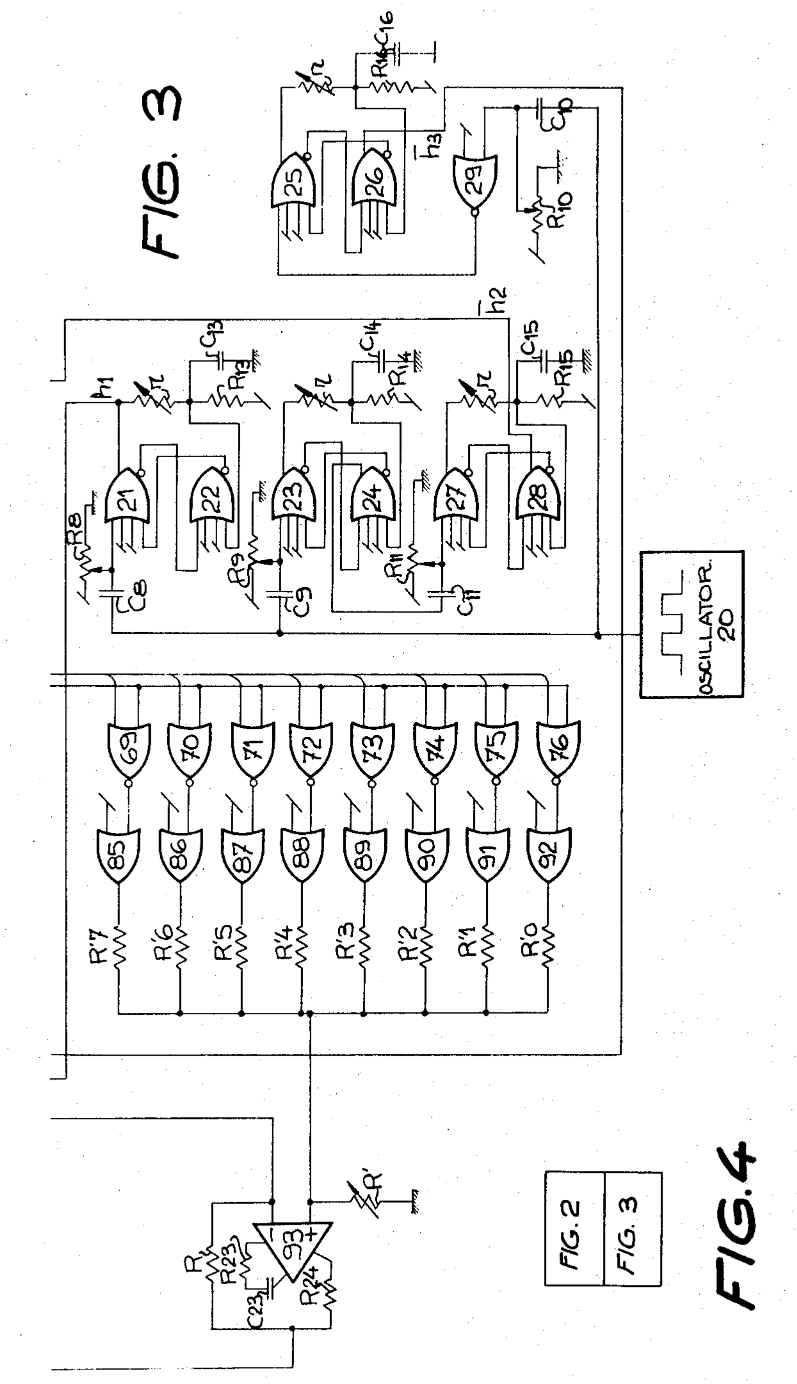
FIG. 4 illustrates the arrangement of FIGS. 2 and 3.

The invention will now be disclosed in more detail with reference to FIGS. 2 and 3 of the drawings which illustrate a preferred embodiment of the invention. FIGS. 2 and 3 of the drawings must be assembled as illustrated in FIG. 4 of the drawings. Referring first to FIG. 3 of the drawings, there is illustrated in detail the clock 13 of FIG. 1 which provides the control signals $h_1$, $\overline{h_2}$ and $\overline{h_3}$ to the flip-flop 12, the up and down counter 15 and the control circuit 14. Such clock comprises an oscillator 20 generating a square wave signal which is applied to three conventional one-shot circuits including OR/NOR gates 21 and 22, 23 and 24, 25 and 26 respectively through conventional RC differentiating circuits providing suitable time delays and identified by references $R_8C_8$ to $R_{10}C_{10}$. Gates 21 and 22 deliver control signal $h_1$ which is controlled by the leading edge of the square wave of the oscillator 20. Gates 23 and 24 deliver a signal to a fourth one-shot circuit including OR/NOR gates 27 and 28 which provide control signal $\overline{h}_2$ two or three microseconds later, the delay being provided by gates 23 and 24 and differentiating circuit $R_{11}C_{11}$. Finally, gates 25 and 26 which are fed through NOR gate 29 acting as an inverter provide control signal $\overline{h_3}$. Control signal $\overline{h_3}$ is generated by the trailing edge of the square wave signal of oscillator 20. All the one-shot circuits have a variable resistor r in the output thereof to vary the period of the pulse delivered thereby. Conventional biasing resistor-capacitor elements $R_{13}C_{13}$ to $R_{16}C_{16}$ are also provided for the one-shot circuits.

Referring now to FIG. 2, the comparator 10 of FIG. 1 is illustrated as an operational amplifier 30 connected as a differential amplifier and including its conventional resistor elements $R_{20}$ and $R_{21}$ determining the gain of the amplifier, potential divider $R_{22}$ and timing capacitor $C_{20}$. For a very small difference between the signals to be compared, the output of differential amplifier 30 is saturated (± 15 v.). A potential divider including resistors $R_A$ and $R_B$ is connected across the output of the differential amplifier and a zener diode Z is connected across resistor $R_B$ for limiting the output voltage across resistor $R_B$ at 0 or −3 v.

The output of differential amplifier 30 appearing across resistor $R_B$ is applied to terminal D of a conventional flip-flop 31 (D type flip-flop). Flip-flop 31 samples the output of the differential amplifier under the control of signal $h_1$ of the clock which is connected to terminal C of the flip-flop. The flip-flop 31 thus contains the most recent sample e of the differential amplifier and such samples appears at the output $\overline{Q}$ while its complement $\overline{e}$ appears at the output Q.

The output of flip-flop 31 is applied to a control circuit corresponding to control circuit 14 of FIG. 1 and including a flip-flop 32 controlled by NOR gate 33 itself under control of signal $\overline{h_3}$ of the clock. The output of the flip-flop 32 in combination with NOR gates 34, 35, 36 and 37 provide the counting signal c and the decounting signal d of the up and down counter 40 which corresponds to the up and down counter 15 of FIG. 1. Input terminal D of the flip-flop 32 is connected to output terminal $\overline{Q}$ of flip-flop 31. The logic equations of the above-mentioned elements of the control circuit are as follows:

$$c = e.e_{-1} + \overline{e}.\overline{e_{-1}}$$

$$d = \overline{c}$$

where $e$ is the value of the sample at time T and $e_{-1}$ is the value of the preceding sample at time (T−1).

The control circuit also includes NOR gates 38 and 39 which are connected to the output of gates 36 and 37 respectively and controlled by input signals $\overline{g_0}$ and $\overline{g_7}$ originating from the lowest and highest output respectively of decoder 16 to be disclosed later. The gate 38 is provided to prevent operation of the up and down counter 40 when the lowest gain $\overline{g_0}$ has been selected and that a new decounting order is given by gate 36 so as to prevent the counter from going to its next lower level. Similarly, gate 39 is provided to prevent the counter from going to its next higher lever when the highest gain $\overline{g_7}$ has been reached and that a new counting order is given by gate 37. The logic equation of gates 38 and 39 is as follows:

$$pc \text{ (no counting)} = g_7.c + g_0.\text{d}$$

When $pc = 1$, the negative pulse $\overline{h_2}$ controlling the operation of the counter and originating from the clock will be cancelled because lead $\overline{h_2}$ is connected to the output of gates 38 and 39 thus providing a wired OR circuit.

The up and down counter 40 is not illustrated in detail because it is a conventional circuit made up of three flip-flops which permit to count from 0 to 7. The output Q and its complement $\overline{Q}$ of each of the flip-flops are shown as $Q_1$, $\overline{Q_1}$, $Q_2$, $\overline{Q_2}$, $Q_3$, $\overline{Q_3}$.

The decoder 16 comprises NOR gates 41 to 48 which are connected to outputs $Q_1$, $Q_1$, $Q_2$, $Q_2$, $Q_3$, $Q_3$, to transform the binary output of up and down counter 40 to a decimal output.

For example, the output of gate 41 is equal to 1 when $Q_1 = Q_2 = Q_3 = 1$. NOR gates 49 to 56 are used as inverters. Thus, if $g_0, g_1, \ldots g_7$ are the control of the eight gains of the amplifier, the outputs of gates 49 to 56 are $\overline{g_7}, \overline{g_6}, \ldots \overline{g_0}$. The output of gates 49 to 56 is connected to the first input of NOR gates 61 to 68 respectively and also to the first input of NOR gates 69 to 76 respectively.

Pulse $\overline{h_3}$ originating from the clock controls the opening of the last logic gate circuit before the amplifier. Such logic gate circuit comprises NOR gates 57 to 58, inverters 59 and 60 connected to gates 57 and 58 respectively, NOR gates 61 to 68 connected to gate 59, and NOR gates 69 to 76 connected to gate 60. The logic function of the signal appearing at the output of inverter 59 is $\overline{h_3.\ e}$ whereas the logic function of the signal appearing at the output of inverter 60 is $\overline{h_3.e}$. Therefore, at the output of gates 61 to 68 appears output $h_3$.e. gi, wherein, $i = 0, 1 \ldots 7$ depending on the predetermined one of gates 49 to 56 of the decoder which is energized as determined by the level of the signal stored in counter 40. Similarly, at the output of gates 69 to 76 appears the logic signal $h_3.\overline{e}.\ gi$, when $i = 0, 1, \ldots 7$. When $h_3 = 0$, all the outputs of the amplifier stages are equal to 0, however, when $h_3 = 1$, one and only one of the gates 61 to 76 will be equal to 1 as determined by the polarity of sample signal $e$ and by the one of the outputs $gi$ which has been energized.

All the above disclosed gates belong to the series MECLII of Motorola. They are non saturated logic elements which have a logic level 1 of −0.7v. and a logic level of −1.8v. Therefore, such elements required adapter OR gates 77 to 92 at the output of each stage of amplification of the amplifer to put the level of the logic signal 1 at +5v and the level of logic signal 0 at 0v.

The outputs of gates 77 to 92 are applied to a known operational amplifier 93 through resistors $R_i$ and $R'_i$, wherein $i = 0, 1, \ldots 7$. The amplitude of the pulses delivered by the amplitude is determined by the ratio $R/R_i$ for the negative pulses and by the ratio $R'/R'_i$ for the positive pulses. The difference between the value of the resistance $R_i$ and $R'_i$ must be very low (0.5%). In addition, R′ is adjustable to equilibrate as much as possible the positive and negative pulses. The operational amplifier is set for proper operation by conventional timing elements $R_{23}$ and $C_{23}$.

The output of the amplifer 93 is applied to operational amplifer 94 acting as an integrator through resistor $R_{24}$ and $R_{25}$. Potentiometer P of the integrator is set so as to prevent any drift of the circuit when there is no pulse applied thereto. Operationel amplifier 94 is set for proper operation through its conventional elements $R_{26}$ to $R_{28}$ and $C_{25}$ to $C_{28}$.

The values of the gains of the feedback loop have been determined on a computer using a test signal of 800 Hz. The criterion used is the average of the signal to noise ratios from 8 amplitudes of the input signal in a range of 42 dB. Such values of the gains expressed in thousandths of the maximum amplitude, peak to peak, which can be transmitted are as follows:

$G_0 = 2.3$, $G_1 = 6.8$, $G_2 = 12.8$, $G_3 = 14.7$, $G_4 = 23.2$, $G_5 = 34.0$, $G_6 = 39.8$, $G_7 = 49.8$.

The free input leads of the elements of FIGS. 2 and 3 are connected to a suitable potential source such as, for example −3v.

The operation of the digital companded modulator in accordance with the invention will now be disclosed with reference to FIG. 1 of the drawings. The comparator 10 compares the analog input signal with the output of the integrator 11 and the output thereof is stored in flip-flop 12. The output of the flip-flop 12 is elaborated by a control circuit 14 which depending upon the present output of the flip-flop ($e$) and upon the previous output of the flip-flop ($e_{-1}$) provides a counting or decounting signal to the counter 15 for increasing or decreasing the level of the signal stored in the counter. The control circuit is also responsive to the highest or lowest input of decoder 16 for disabling the operation of the up and down counter when such highest or lowest value has been reached and further counting or decounting orders would be normally given by the control circuit.

A decoder 16 is provided for converting the binary output of up and down counter 15 into a series of decimal outputs $a, b, \ldots h, -a, -b, \ldots -h$ depending on the positive or negative level of the signal stored in the counter.

AND gates 17 and 17' are provided for connecting the output of the binary circuit 12 to the amplifier 18. Such gates are connected to the various values of amplification of amplifier 18, which values of amplification correspond to different gains. Thus, the gain of the amplifier 18 is determined by the predetermined one of the output of the decoder 16 which is energized. It is to be noted that the gain may be positive or negative depending on whether outputs *a, b,* . . . *h* or outputs *—a, —b,* . . . *—h* of the decoder are energized.

It will be understood that the output of amplifier 18 will appear as discrete step signals which will be applied to integrator 11. Thus, if a great number of positive or negative pulses appear at the output of flip-flop 12, the level of counter 15 will increase accordingly and so will the gain of the amplifier 18. Thus the step signals appearing at the output of the amplifier 18 will be higher and this will permit the integrator to reach the value of the analog signal much faster and to subsequently follow more closely such analog signal.

Although the invention has been disclosed with reference to a preferred embodiment thereof, it is to be understood that various modifications may remain thereto within the ambit of the invention. The scope of the invention is thus to be determined by the accompanying claims.

We claim:

1. A digital companded delta modulator comprising:

a. a comparator having a first and a second input and a single output, said first input being connected to receive an input analog signal;

b. a clock;

c. pulse generating means connected to the output of said comparator and responsive to said clock for generating binary pulses;

d. a binary up and down counter having a binary output;

e. a control circuit interconnecting said pulse generating means and said up and down counter, said control circuit making the decision as to whether an up count, a down count or no count at all is required;

f. a decoder for converting the binary output of said up and down counter into a number of decimal outputs;

g. amplifying means having a corresponding number of values of gains connected to said decoder outputs; and h. an integrator connected to said amplifier and having an output connected to said second input of said comparator, whereby said comparator compares the output signal of said integrator with the input analog signal and generates a signal depending on the difference between the two signals.

2. A digital companded delta modulator as defined in claim 1, wherein said pulse generating means comprises a first flip-flop for storing output pulses of said comparator, said flip-flop having an output terminal.

3. A digital companded delta modulator as defined in claim 2, wherein said control circuit includes a second flip-flop connected to the output terminal of said first flip-flop and responsive to said clock for storing the preceding output pulse of said comparator, said control circuit being responsive to said first and second flip-flops and to the actual state of the counter for providing control signals to the counter for an up count, a down count or no count at all.

4. A digital companded delta modulator as defined in claim 3, wherein the portion of control circuit providing the no count signal includes means responsive to the lowest and highest output of said decoder for disabling the operation of the counter when the lowest value of the counter has been reached and a down count signal occurs and when the highest level of the counter has been reached and an up count signal occurs.

5. A digital companded delta modulator as defined in claim 1, wherein the decoder has eight decimal outputs and wherein the amplying means includes eight positive and eight negative values of gains controlled by corresponding outputs of said decoder.

6. A digital companded delta modulator as defined in claim 5, further comprising gate means connected to said pulse generating means and to said decoder for operating the corresponding positive or negative values of gains of said amplying means.

7. A digital companded delta modulator as defined in claim 3, wherein said clock includes an oscillator generating a square wave output and three one-shot circuits responsive to said oscillator for generating three pulses shifted with respect to each other, the first pulse corresponding to the leading edge of the square wave and controlling the operation of the first flip-flop the second pulse occurring a predetermined time interval later and controlling the operation of the up and down counter, and the third pulse corresponding to the trailing edge of the square wave and controlling the operation of said control circuit.

* * * * *